(12) United States Patent
Lai et al.

(10) Patent No.: US 11,963,385 B2
(45) Date of Patent: Apr. 16, 2024

(54) LOCAL STRETCH PACKAGE STRUCTURE AND MANUFACTURING METHOD THEREOF

(71) Applicants: Interface Technology (ChengDu) Co., Ltd., Sichuan (CN); Interface Optoelectronics (ShenZhen) Co., Ltd., Guangdong (CN); General Interface Solution Limited, Miaoli County (TW)

(72) Inventors: Wen-You Lai, Guangdong (CN); Ping-Hsiang Kao, Guangdong (CN); Po-Lun Chen, Guangdong (CN); Chun-Ta Chen, Guangdong (CN); Po-Ching Lin, Guangdong (CN); Ya-Chu Hsu, Guangdong (CN)

(73) Assignees: Interface Technology (ChengDu) Co., Ltd., Sichuan (CN); Interface Optoelectronics (ShenZhen) Co., Ltd., Guangdong (CN); General Interface Solution Limited, Miaoli County (TW)

( * ) Notice: Subject to any disclaimer, the term of this patent is extended or adjusted under 35 U.S.C. 154(b) by 314 days.

(21) Appl. No.: 17/452,233

(22) Filed: Oct. 25, 2021

(65) Prior Publication Data
US 2023/0099272 A1 Mar. 30, 2023

(30) Foreign Application Priority Data
Sep. 30, 2021 (CN) .......................... 202111163501.8

(51) Int. Cl.
*H10K 50/844* (2023.01)
*H01L 25/075* (2006.01)
(Continued)

(52) U.S. Cl.
CPC ....... *H10K 50/844* (2023.02); *H01L 25/0753* (2013.01); *H01L 27/156* (2013.01);
(Continued)

(58) Field of Classification Search
CPC ...... H10K 50/844; H10K 59/90; H10K 71/00; H10K 77/111; H10K 2102/311; H10K 2101/00; H10K 2102/351; H10K 50/84; H10K 59/10; H01L 25/0753; H01L 27/156; H01L 33/52; H01L 2933/005;
(Continued)

(56) References Cited

U.S. PATENT DOCUMENTS

2015/0236309 A1* 8/2015 Rohatgi ................. H10K 71/00
65/36
2017/0033162 A1* 2/2017 Rohatgi ............ H10K 50/8426
(Continued)

*Primary Examiner* — Joe E. Schoenholtz
(74) *Attorney, Agent, or Firm* — CKC & Partners Co., LLC

(57) ABSTRACT

The disclosure provides a local stretch packaging structure, including a substrate, a flexible electronic element, a plurality of light-emitting display elements, and a packaging layer. The flexible electronic element is disposed on the substrate. These light-emitting display elements are disposed on the flexible electronic element. The packaging layer includes a packaging area and a non-packaging area. The packaging area covers the upper surface and sidewalls of these light-emitting display elements. The non-packaging area is directly covered the flexible electronic element that is not disposed with these light-emitting display elements.

18 Claims, 9 Drawing Sheets

(51) Int. Cl.
  *H01L 27/15* (2006.01)
  *H01L 33/52* (2010.01)
  *H10K 59/90* (2023.01)
  *H10K 71/00* (2023.01)
  *H10K 77/10* (2023.01)
  *H10K 102/00* (2023.01)

(52) U.S. Cl.
  CPC ............. *H01L 33/52* (2013.01); *H10K 59/90* (2023.02); *H10K 71/00* (2023.02); *H01L 2933/005* (2013.01); *H10K 77/111* (2023.02); *H10K 2102/311* (2023.02)

(58) Field of Classification Search
  CPC . H01L 33/44; H01L 33/56; H01L 2933/0025; H01L 33/54; H05K 1/0283; H05K 3/287; H05K 3/285; H05K 2201/09872; H05K 2201/10106; H05K 2201/10204; Y02E 10/549
  See application file for complete search history.

(56) References Cited

U.S. PATENT DOCUMENTS

| | | | |
|---|---|---|---|
| 2019/0376650 A1* | 12/2019 | Pang | H10K 59/18 |
| 2020/0029403 A1* | 1/2020 | Chaturvedi | H01L 25/0753 |
| 2020/0212117 A1* | 7/2020 | Jeon | G09F 9/301 |
| 2021/0327956 A1* | 10/2021 | Wang | H10K 71/80 |

* cited by examiner

LOCAL STRETCH PACKAGE STRUCTURE AND MANUFACTURING METHOD THEREOF

CROSS-REFERENCE TO RELATED APPLICATION

This application claims priority to China Application Serial Number 202111163501.8 filed on Sep. 30, 2021, which is herein incorporated by reference in its entirety.

BACKGROUND

Field of Invention

The present disclosure relates to a local stretch packaging structure and manufacturing method thereof, especially relates to a local stretch packaging structure and manufacturing method of which the local stretching phenomenon occurs only in the non-packaging area during deformation.

Description of Related Art

With the application of display device being more and more widely, the application of display is gradually developed from flat display to curved display. The molding method of the display is mainly by thermoplastic molding. Thermoplastic molding gives the product plastic performance. Because of the metal wires or electronic components in the display, they are easy to be broken by large elasticity in the forming process, and not easy to process. Thus the implementation is still difficult. At present, the types of display products can only reach large radius of curvature in terms of flexible bending performance, and the molding of small radius of curvature is still a lack of technology.

In LCD (liquid-crystal display), LED (light-emitting diode) or OLED (organic light-emitting diode) display packaging process, it is known to be covered with multi-layer organic or inorganic film of uniform thickness, or to package single or multiple dies to achieve protection against water, air and chemical substances. When the size of mini/micro LED getting smaller, it is more difficult to carry out packaging method. In addition, at present, flexible display can only be presented in uniaxial bending, which is not available in the shape of biaxial or multi-axial surfaces, so the packaging method is not suitable for the processing of form-fitting surfaces. In addition, the traditional packaging materials are mainly silicone material, whose glass transition temperature and storage modulus are low, and it is only used to resist external substances, without the protection of mechanical properties.

In view of this, how to design a packaging structure of light-emitting device to avoid bending damage of metal wires or electronic components in the display, so as to overcome the defects and shortcomings of existing technology, is one of the urgent issues to be solved.

SUMMARY

The purpose of the present disclosure is to provide a local stretch packaging structure, including a substrate, a flexible electronic element, many light-emitting display elements, and a packaging layer. The flexible electronic element is disposed on the substrate. These light-emitting display elements are disposed on the flexible electronic element. The packaging layer includes a packaging area and a non-packaging area. The packaging area covers the upper surface and sidewalls of each one of these light-emitting display elements. The non-packaging area is directly covered the flexible electronic element that is not disposed with these light-emitting display elements.

In some embodiments of the present disclosure, a height of the packaging area is higher than a height of the non-packaging area.

In some embodiments of the present disclosure, a volume ratio of the non-packaging area to the packaging area is less than 1.

In some embodiments of the present disclosure, an elasticity of the non-packaging area is higher than an elasticity of the packaging area, and the elasticity difference between the non-packaging area and the packaging area is higher than or equal to 10%.

In some embodiments of the present disclosure, at a processing temperature of the substrate, when a storage modulus of the substrate is higher than a storage modulus of the packaging layer, an elasticity of the non-packaging area is higher than 30%, and the elasticity of the non-packaging area increases with the increase of the storage modulus difference between the substrate and the packaging layer. When the storage modulus of the substrate is lower than the storage modulus of the packaging layer, the elasticity of the non-packaging area is lower than 30%, and the elasticity of the non-packaging area decreases with the increase of the storage modulus difference between the substrate and the packaging layer.

In some embodiments of the present disclosure, a storage modulus of the substrate at a processing temperature is from 1 MPa to 20000 MPa.

In some embodiments of the present disclosure, the substrate is made of polycarbonate, polymethyl methacrylate, polyethylene terephthalate, cyclic olefin polymers or a combination thereof.

In some embodiments of the present disclosure, these of light-emitting display elements includes light-emitting diodes, mini light-emitting diodes, micro light-emitting diodes, organic light-emitting diodes, or a combination thereof.

In some embodiments of the present disclosure, the packaging layer is made of epoxy resin, silicone, acrylic resin or a combination thereof.

In some embodiments of the present disclosure, a storage modulus of the packaging layer at a processing temperature of the substrate is from 1 MPa to 10000 MPa.

In some embodiments of the present disclosure, a glass transition temperature is from −20° C. to 150° C.

The other purpose of the present disclosure is to provide a method of manufacturing a local stretch packaging structure, including the steps of providing a substrate; disposing a flexible electronic element on the substrate; disposing many light-emitting display elements on the flexible electronic element; and disposing a packaging layer on these light-emitting display elements and a portion of the flexible electronic element. And the packaging layer includes a packaging area and a non-packaging area, the packaging area covers an upper surface and sidewalls of each one of these light-emitting display elements, and the non-packaging area directly covers the flexible electronic element that is not disposed with these light-emitting display elements.

In some embodiments of the present disclosure, the step of disposing the packaging layer on these light-emitting display elements and the portion of the flexible electronic element includes measuring and coating a packaging material on these light-emitting display elements and the portion of the flexible electronic element; aligning many recesses of a mold to these light-emitting display elements, and aligning many protrusions of the mold to the flexible electronic element that is not disposed with these light-emitting display elements; pressing the mold, and heating and solidifying the packaging material, then forming the packaging layer on these light-emitting display elements and the portion of the flexible electronic element; and cooling the packaging layer and removing the mold.

In some embodiments of the present disclosure, the step of disposing the packaging layer on these light-emitting display elements and the portion of the flexible electronic element includes aligning many recesses of a mold to these light-emitting display elements, and aligning many protrusions of the mold to the flexible electronic element that is not disposed with these light-emitting display elements, wherein the mold is not attached with these light-emitting display elements and the flexible electronic element; injecting a packaging material between the mold and these light-emitting display elements and the flexible electronic element; heating and solidifying the packaging material, then forming the packaging layer on these light-emitting display elements and the portion of the flexible electronic element; and cooling the packaging layer and removing the mold.

In some embodiments of the present disclosure, the mold is made of vulcanized silicone rubber, polydimethylsiloxane or a combination thereof.

In some embodiments of the present disclosure, the step of disposing the packaging layer on these light-emitting display elements and the portion of the flexible electronic element includes measuring and coating a packaging material along the upper surface and sidewalls of each one of these light-emitting display elements and surfaces of the portion of the flexible electronic element; and applying UV light to solidify the packaging material, so that the packaging layer is formed on these light-emitting display elements and the portion of the flexible electronic element.

In some embodiments of the present disclosure, the step of coating the packaging material includes screen printing process or spin coating process.

In some embodiments of the present disclosure, a height of the packaging area is higher than a height of the non-packaging area.

In some embodiments of the present disclosure, an elasticity of the non-packaging area is higher than an elasticity of the packaging area, and the elasticity difference between the non-packaging area and the packaging area is higher than or equal to 10%.

In some embodiments of the present disclosure, a volume ratio of the non-packaging area to the packaging area is less than 1.

BRIEF DESCRIPTION OF THE DRAWINGS

The present disclosure can be more fully understood by reading the following detailed description of the embodiment, with reference made to the accompanying drawings as follows. It should be understood that, according to industry practice, the various features are not drawn to scale. In fact, for the sake of clarity, the size of the various features can be arbitrarily increased or decreased.

DETAILED DESCRIPTION

Figure 1:
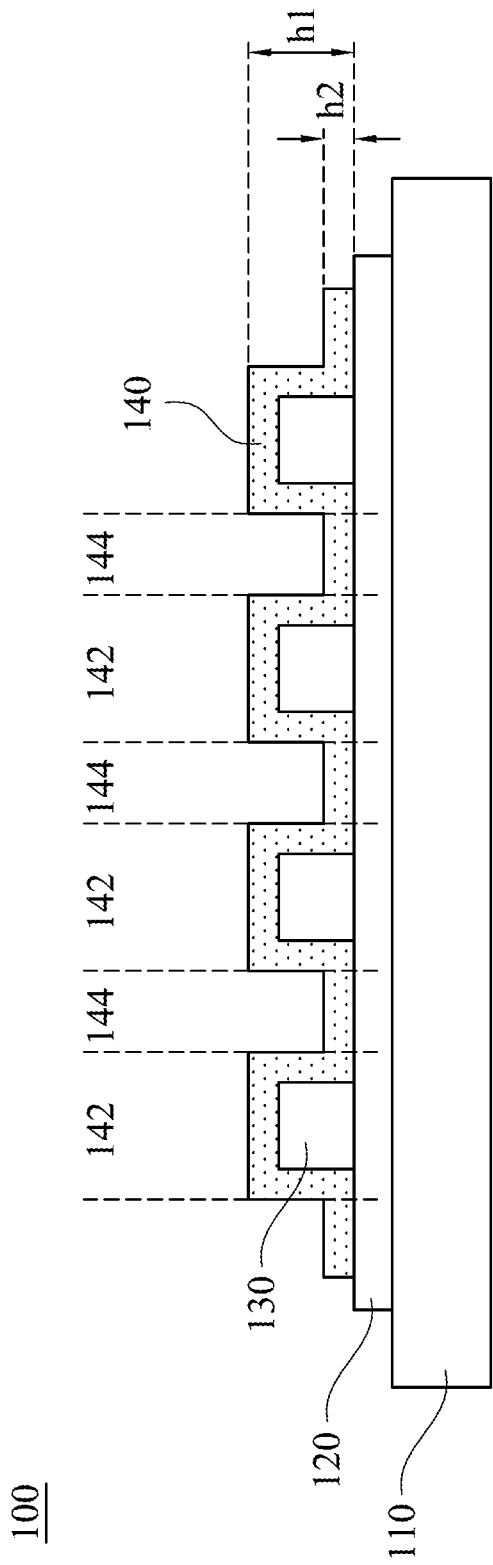
FIG. 1 is a cross-section view of the local stretch packaging structure according to some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure provides a local stretch packaging structure. It should be noted firstly that the local stretch here refers to the curved surface structure or bending structure in the display device. The stretching phenomenon caused by bending, surface forming or bending would usually occur in the non-packaging area. Therefore, the stretching phenomenon does not occur in the package area with the light-emitting display elements, so as to avoid damage to the metal wires or electronic components in the light-emitting display elements when bending or forming the surface. The local stretch packaging structure of the present disclosure can be applied to any light-emitting device or display device with curved forming function.

This present disclosure reveals that the packaging layer is configured with packaging area and non-packaging area, and the height of the non-packaging area is lower than the packaging area, so as to form the packaging layer with different thickness. Compared with the packaging layer with the same thickness and the co-planar upper surface of the present technology, in the bending or curved forming device, the present disclosure makes the stretching phenomenon occur in the non-packaging area. Thus, the packaging adhesive layer can effectively protect the light-emitting display elements and its metal wires or electronic components in the packaging area.

Firstly, please refer to FIG. 1, FIG. 1 is a cross-section view of the local stretch packaging structure according to some embodiments of the present disclosure. In some embodiments of the present disclosure, the present disclosure provides a local stretch packaging structure 100, including a substrate 110, a flexible electronic element 120, many light-emitting display elements 130, and a packaging layer 140. In one embodiment, the substrate 110 could ideally be transparent substrate, and particularly be flexible transparent substrate. Materials of the substrate 110 could be selected from polyethylene terephthalate (PET), polymethylmethacrylate (PMMA), polycarbonate (PC), cyclo olefin polymer (COP) or the combination thereof. In one embodiment, the processing temperature of the substrate 110 is from 80° C. to 180° C. And, at the aforementioned processing temperature, the storage modulus of the substrate 110 is from 1 MPa to 20000 MPa. In some examples, the storage modulus of the substrate 110 at the aforementioned processing temperature includes, but no limited to, 1 MPa, 2000 MPa, 4000 MPa, 6000 MPa, 8000 MPa, 10000 MPa, 12000 MPa, 14000 MPa, 16000 MPa, 18000 MPa, 20000 MPa, or any value between these equivalent values.

In some embodiments of the present disclosure, the flexible electronic element 120 is disposed on the substrate 110. The flexible electronic element 120 is used to connect the light-emitting display elements 130 with external power supply. In one embodiment, the flexible electronic element 120 may be a soft printed circuit board or any flexible conductive material. In some embodiments of the present disclosure, the light-emitting display elements 130 are disposed on the flexible electronic element 120. The light-emitting display elements 130 may be arranged or disposed in a random or array arrangement. In one embodiment, these light-emitting display elements 130 include light-emitting diodes (LED), mini LED, micro LED, organic light-emitting diode (OLED) or a combination thereof.

In some embodiments of the present disclosure, the packaging layer 140 includes the packaging area 142 and the non-packaging area 144. The packaging area 142 covers the upper surface and side walls of the light-emitting display elements 130. The non-packaging area 144 is directly overlaid on the flexible electronic element 120 without these light-emitting display elements 130. In one embodiment, for good flexibility or elasticity, the material of the packaging layer 140 includes epoxy resin, silicone, acrylic resin, or a combination thereof. In one embodiment, the storage modulus of the packaging layer 140 is from 1 MPa to 10000 MPa at the aforementioned processing temperature range of the substrate 110 (i.e., 80° C. to 180° C.). In some embodiments, the storage modulus of the packaging layer 140 at the aforementioned processing temperature range of the substrate 110 includes, but is not limited to, 1 MPa, 2000 MPa, 4000 MPa, 6000 MPa, 8000 MPa, 10000 MPa, or any value between these equivalent values. In one embodiment, the glass transition temperature of the packaging layer 140 is from −20° C. to 150° C. In some embodiments, the glass transition temperature of the packaging layer 140 includes, but is not limited to, −20° C., −10° C., 0° C., 10° C., 20° C., 30° C., 40° C., 50° C., 60° C., 70° C., 80° C., 90° C., 100° C., 110° C., 120° C., 130° C., 140° C., 150° C. or any value between these equivalent values.

Figure 2:
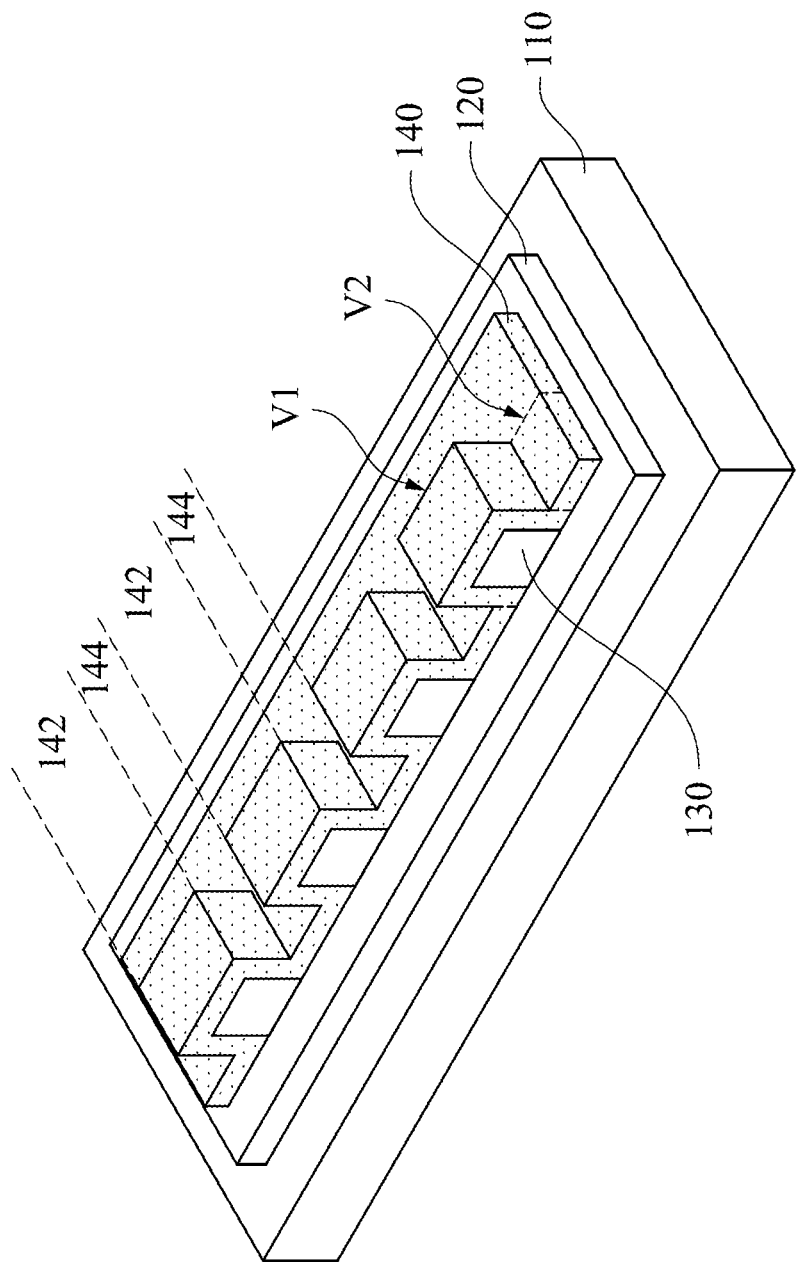
FIG. 2 is a 3-D cross-section view of the local stretch packaging structure according to some embodiments of the present disclosure.

Here, it must be explained firstly that the present disclosure makes use of the difference in volume, thickness and elasticity between the packaging area 142 and the non-packaging area 144 of the packaging layer 140, so that when bending or curved surface is formed, the stretching phenomenon would preferentially occur in the non-packaging area 144, so as to avoid damage to the circuit or electronic components in the packaging area 142. For a clearer understanding of the characteristics of the packaging layer 140 of the present disclosure, please refer to FIG. 1 and FIG. 2. FIG. 2 is a 3-D cross-section view of the local stretch packaging structure according to some embodiments of the present disclosure. As shown in FIG. 1 and FIG. 2, in one embodiment, the height h1 of the packaging area 142 in the packaging layer 140 is higher than the height h2 of the non-packaging area 144. Therefore, when stretching occurs, the space above the non-packaging area 144 can be used as the reserved space for the rotation of the packaging area 142 when bending or curved surface is formed.

As shown in FIG. 2, in one embodiment, the volume V2 of the non-packaging area 144 is smaller than the volume V1 of the packaging area 142, and the volume ratio of the non-packaging area 144 to the packaging area 142 is less than 1. Specifically, the volume V1 of the packaging area 142 refers to the volume of the packaging material and the light-emitting display elements 130 in the packaging area 142. Accordingly, it also conforms to the height difference between the packaging area 142 and the non-packaging area 144 mentioned above. And, the space above the non-packaging area 144 could be reserved for rotation of the packaging area 142 when bending or curved surface is formed.

Figure 3:
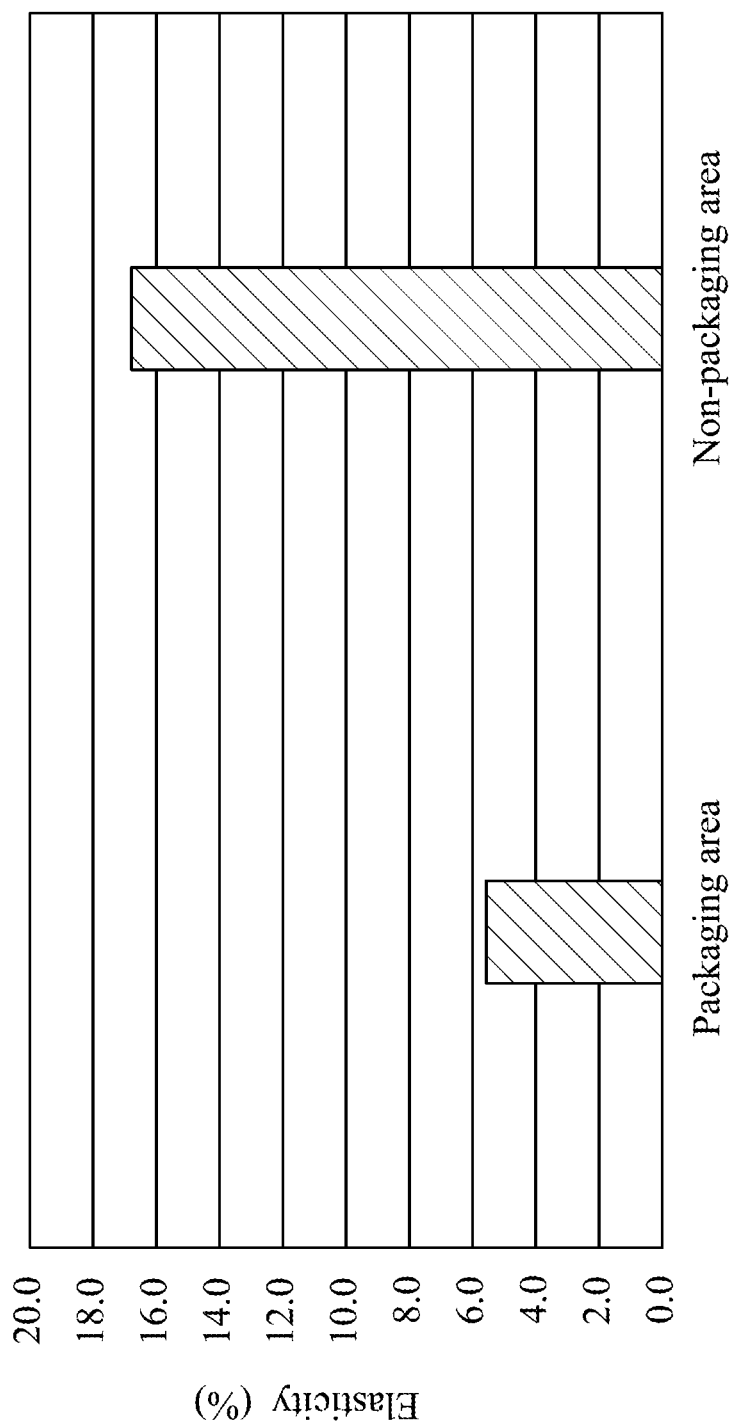
FIG. 3 is an elasticity bar chart of the packaging area and the non-packaging area according to some embodiments of the present disclosure.

Next, please refer to FIG. 3, FIG. 3 is an elasticity bar chart of the packaging area and the non-packaging area according to some embodiments of the present disclosure. According to the local stretch packaging structure 100 shown in FIG. 1 and FIG. 2 of the present disclosure, the elasticity of the packaging area 142 and the non-packaging area 144 could be measured. As shown in FIG. 3, in one embodiment, the elasticity of the non-packaging area 144 is greater than that of the packaging area 142. And the difference between the elasticity of the non-packaging area 144 and the packaging area 142 is greater than or equal to 10%. Because the elasticity of the non-packaging area 144 is different from that of the packaging area 142 to a certain extent, the stretching phenomenon preferentially occurs in the non-packaging area 144 rather than in the packaging area 142. In one embodiment, the elasticity of the packaging area 142 is ranged from approximately 4% to approximately 6%, and the elasticity of the non-packaging area 144 is ranged from approximately 14% to approximately 18%. In some embodiments, the elasticity of the packaging area 142 includes, but is not limited to, 4%, 4.2%, 4.4%, 4.6%, 4.8%, 5%, 5.2%, 5.4%, 5.6%, 5.8%, 6% or any value between these equivalent values. In some embodiments, the elasticity of the non-packaging area 144 includes, but is not limited to, 14%, 14.4%, 14.8%, 15.2%, 15.6%, 16%, 16.4%, 16.8%, 17.2%, 17.6%, 18%, or any value between these equivalent values. It should be noted that the elasticity shown here is only for example and should not be used to limit the present disclosure. It is important to note that the elasticity of the non-packaging area 144 is more than 10% higher than that of the packaging area 142.

Figure 4A:
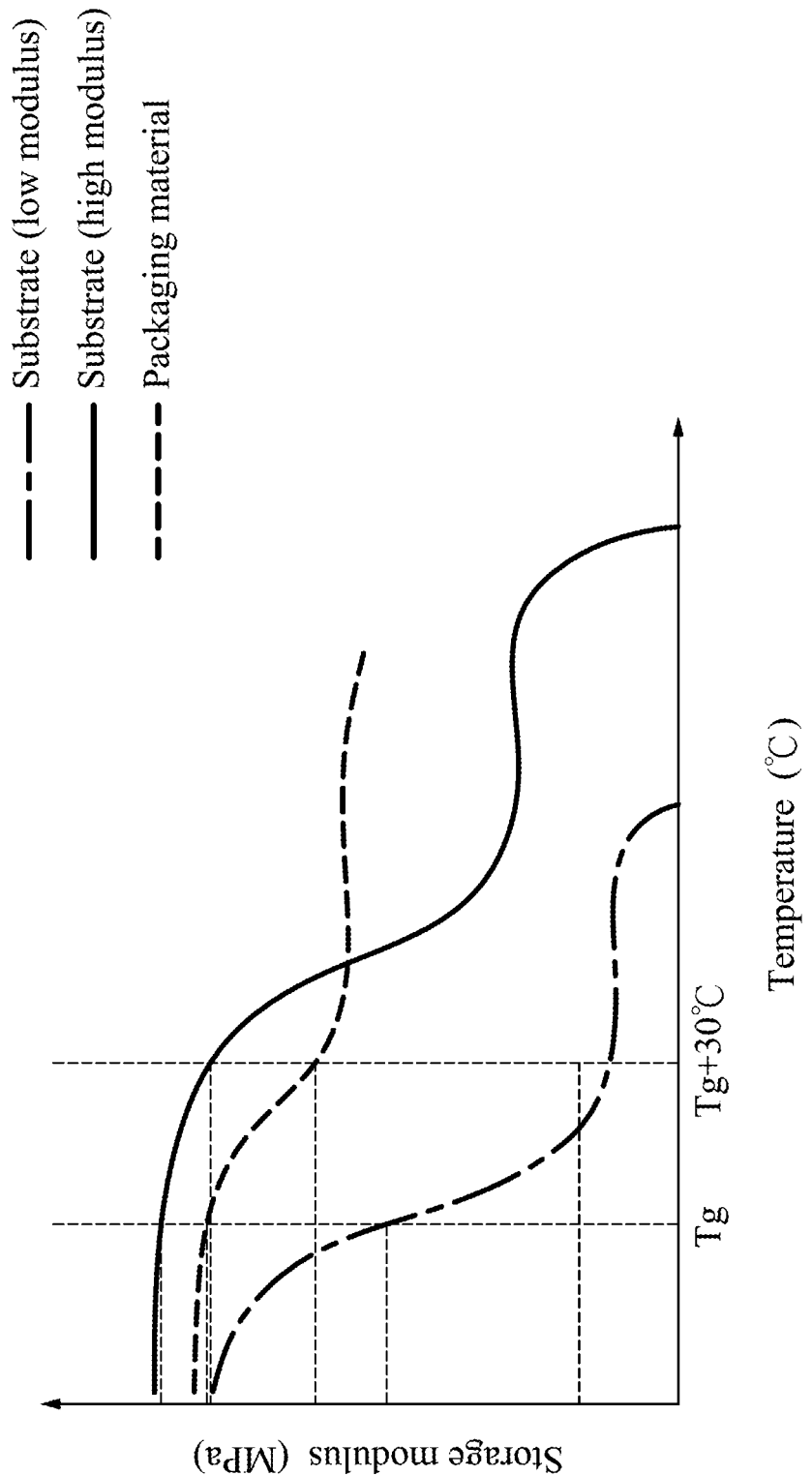
FIG. 4A is a storage modulus and temperature curve diagram of the substrate and the packaging material according to some embodiments of the present disclosure.

In order to enable the present disclosure to be applied to more devices with different degrees of bending or stretching, the present disclosure further uses the storage modulus difference between the packaging layer 140 and the substrate 110 at different temperatures to control the elasticity of the non-packaging area 144. Please refer firstly to FIG. 4A, FIG. 4A is a storage modulus and temperature curve diagram of the substrate and the packaging material according to some embodiments of the present disclosure, where Tg shows the glass transition temperature of the packaging material. FIG. 4A shows that the storage modulus of the substrate 110 would decrease significantly with the increase of temperature, while the storage modulus of the packaging material in the packaging layer 140 would decrease less than that of the substrate 110. That is, at low temperature, the storage modulus of the substrate 110 is greater than the packaging layer 140, and at high temperature, the storage modulus of the substrate 110 is less than the packaging layer 140.

Figure 4B:
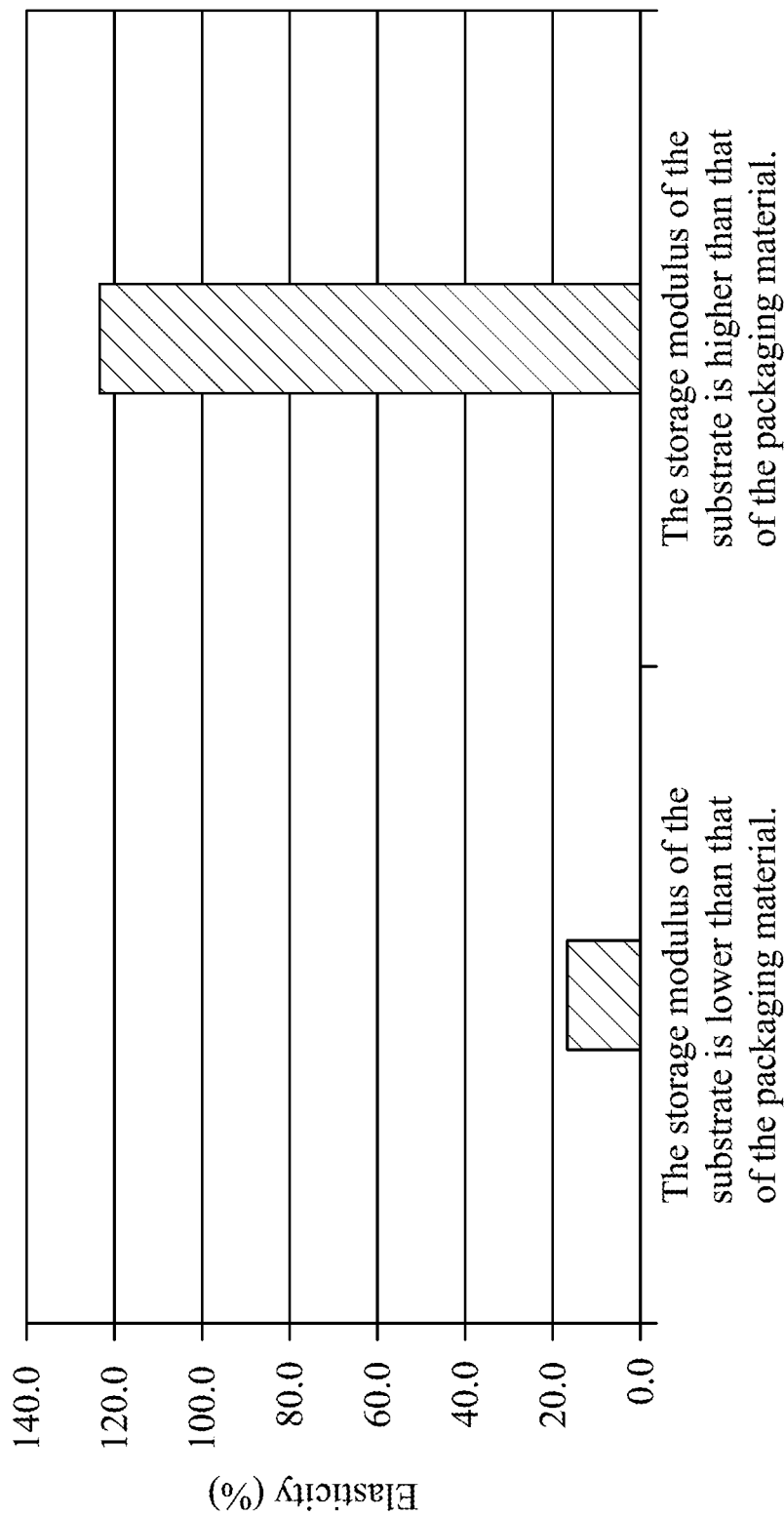
FIG. 4B is an elasticity bar chart of the substrate and the packaging material with different storage modulus according to some embodiments of the present disclosure.

Then, please refer to FIG. 4B, FIG. 4B is an elasticity bar chart of the substrate and the packaging material with different storage modulus according to some embodiments of the present disclosure. In one embodiment, when the storage modulus of the substrate 110 is greater than that of the packaging layer 140, the elasticity of the non-packaging area 144 is greater than 30%, and the elasticity of the non-packaging area 144 increases with the difference of the storage modulus between the substrate 110 and the packaging layer 140. When the storage modulus of the substrate 110 is less than that of the packaging layer 140, the elasticity of the non-packaging area 144 is less than 30%, and the elasticity of the non-packaging area 144 decreases with the increase of the difference of the storage modulus between the substrate 110 and the packaging layer 140. FIG. 4B shows that when the storage modulus of the substrate 110 is less than that of the packaging material in the packaging layer 140, the elasticity of the non-packaging area 144 is about 18%; when the storage modulus of the substrate 110 is greater than that of the packaging material in the packaging layer 140, the elasticity of the non-packaging area 144 is about 122%.

Accordingly, it can be seen from the FIG. 4A and FIG. 4B that the present disclosure can make the non-packaging area 144 have different elasticity through the storage modulus difference between the substrate 110 and the packaging layer 140, so the present disclosure can be applied to more devices with different bending or tensile degrees.

The structural and technical characteristics of the local stretch packaging structure 100 disclosed in the present disclosure have been described above. The following will describe the various manufacturing processes of the local stretch packaging structure 100. It should be noted that the substrate 110, the flexible electronic element 120, and these light-emitting display elements 130 are formed by deposition process, etching process, bonding process, or a combination thereof. The following is only for the formation method of packaging layer 140. In addition, the characteristics and material contents of the substrate 110, the flexible electronic element 120, these light-emitting display elements 130 and the packaging layer 140 have been described above, so it will not be described below.

Figure 5:
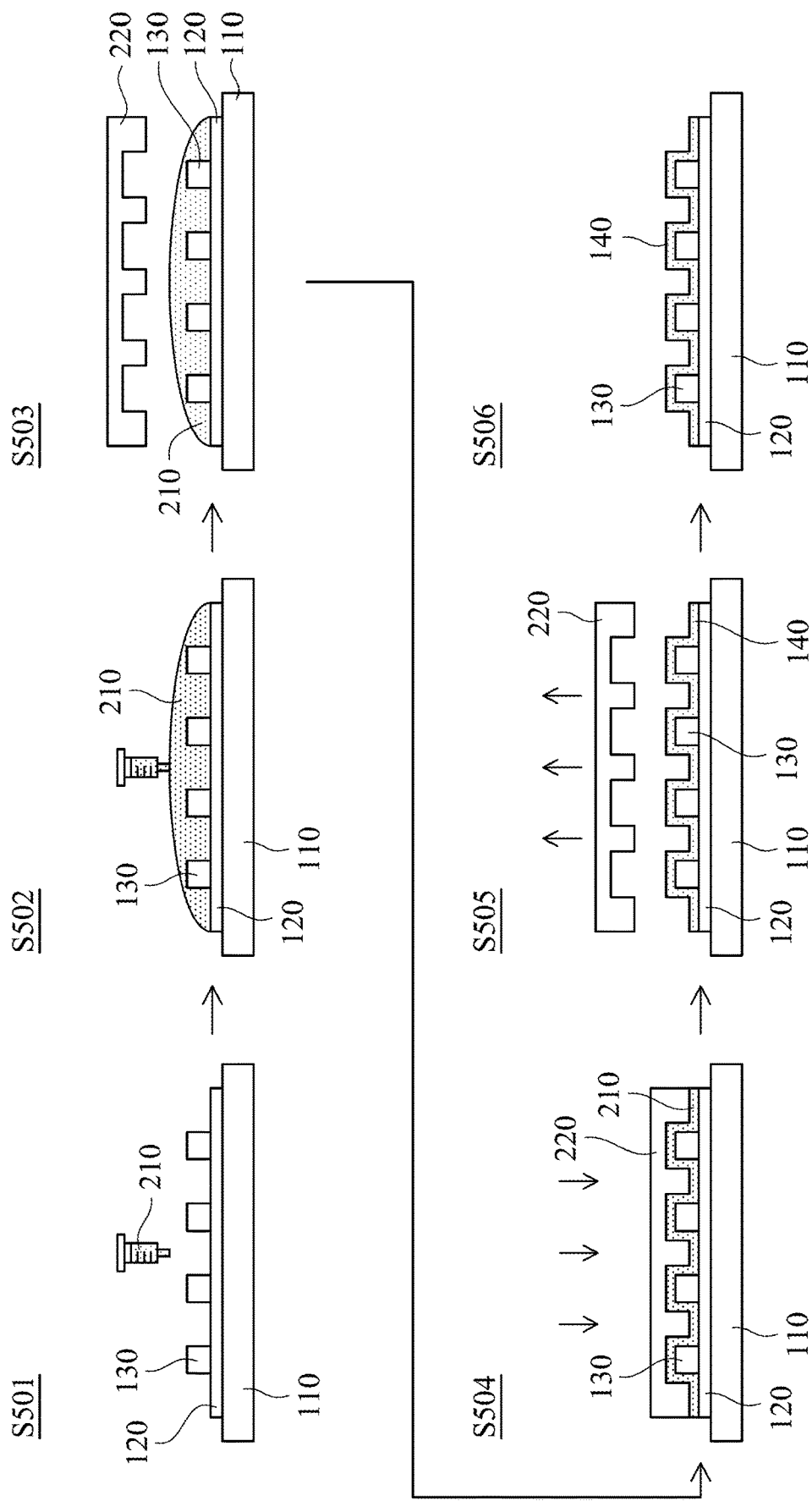
FIG. 5 is a flow diagram of forming the packaging layer by nanoimprint lithography according to some embodiments of the present disclosure.

Please refer to FIG. 5, FIG. 5 is a flow diagram of forming the packaging layer by nanoimprint lithography according to some embodiments of the present disclosure. As shown in step S501, the substrate 110, the flexible electronic element 120 and these light-emitting display elements 130 are provided, and the colloidal packaging material 210 is measured and ready to be coated on the flexible electronic element 120 and these light-emitting display elements 130.

The step S502, coat the colloid packaging material 210 measured in the step S501 on the flexible electronic element 120 and these light-emitting display elements 130.

Then, please refer to the steps S503 and S504 at the same time, prepare the mold 220 with recesses (not labeled) and protrusions (not labeled), align these recesses of mold 220 with these light-emitting display elements 130, and align these protrusions with the flexible electronic element 120 without these light-emitting display elements 130. Next, the mold 220 is pressed and heated to solidify the colloidal packaging material 210, so that the packaging layer 140 is formed on the light-emitting display elements 130 and part of the flexible electronic element 120.

Finally, as shown in the steps S505 and S506, after the mold 220 is removed and cooled, the local stretch packaging structure 100 of the present disclosure is produced. The packaging layer 140 of different thickness is used to make the stretching phenomenon preferentially occur in the non-package area 144, and avoid bending or curved surface forming damage to metal wires or electronic components in the light-emitting display elements 130.

Figure 6:
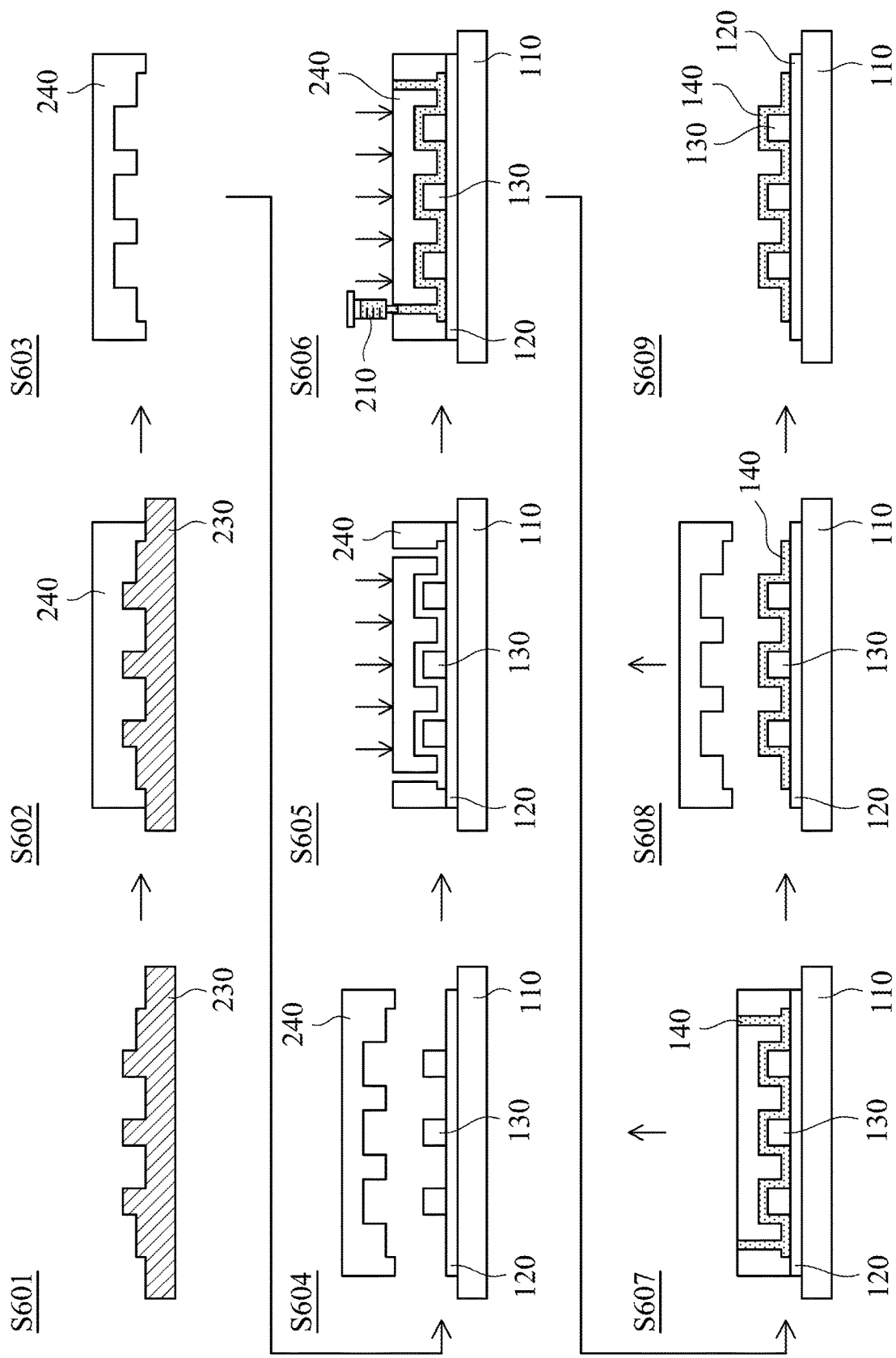
FIG. 6 is a flow diagram of forming the packaging layer by nanoimprint lithography and microflow resin injection molding process according to some embodiments of the present disclosure.

Please refer to FIG. 6. FIG. 6 is a flow diagram of forming the packaging layer by nanoimprint lithography and microflow resin injection molding process according to some embodiments of the present disclosure. In the manufacturing process shown in FIG. 6, the injection mold 240 required for injection molding must be made first. Firstly, take the original mold 230 as shown in the steps S601 to S603 and coat vulcanized silicone resin or polydimethylsiloxane on the original mold 230 to obtain the injection mold 240.

Refer to the steps S604 to S606 to provide the substrate 110, the flexible electronic element 120 and multiple light-emitting display elements 130, align multiple recesses of the injection mold 240 with these light-emitting display elements 130, and align multiple protrusions with the flexible electronic element 120 without these light-emitting display elements 130. After the injection mold 240 is combined with the flexible electronic element 120 and these light-emitting display elements 130, it should be noted that because the injection mold 240 is used to manufacture the packaging layer 140, the inside of the injection mold 240 will not completely fit the flexible electronic element 120 and the light-emitting display elements 130. Instead, it will be separated from the flexible electronic element 120 and these light-emitting display elements 130 for an interval. Then, the measured colloidal packaging material 210 is injected into the interval from the outside of the injection mold 240.

Then refer to the steps S607 to S609. After injecting the colloidal packaging material 210, heat it to solidify the colloidal packaging material 210, so that the packaging layer 140 is formed on these light-emitting display elements 130 and part of the flexible electronic elements 120. After the injection mold 240 is removed and cooled, the local stretch packaging structure 100 revealed in the present disclosure is created. The packaging layer 140 of different thickness is used to make the stretching phenomenon preferentially occur in the non-package area 144, and avoid bending or curved surface forming damage to metal wires or electronic components in the light-emitting display elements 130.

Figure 7:
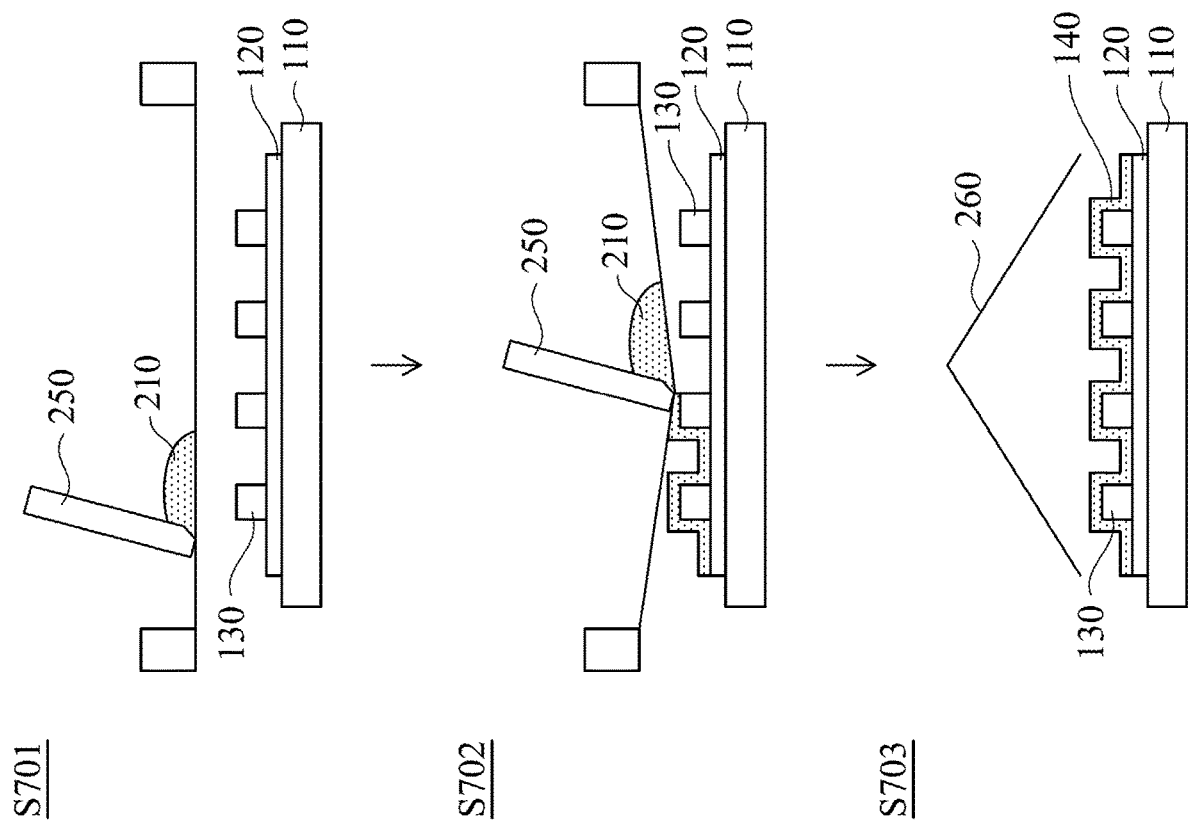
FIG. 7 is a flow diagram of forming the packaging layer by screen printing process according to some embodiments of the present disclosure.

Please refer to FIG. 7. FIG. 7 is a flow diagram of forming the packaging layer by screen printing process according to some embodiments of the present disclosure. As shown in the step S701, provide the substrate 110, the flexible electronic element 120 and these light-emitting display elements 130. And, at the same time, the colloidal package material 210 is measured and placed in the screen printing device 250, and the colloidal package material 210 is ready to be coated on the flexible electronic element 120 and these light-emitting display elements 130.

Next, as shown in the step S702, the screen printing process is carried out by the screen printing device 250, and the colloidal packaging material 210 is coated on the flexible electronic element 120 and these light-emitting display elements 130, and the packaging structure of different thickness is formed. Finally, the UV light 260 is used to perform the solidifying process, so that the colloidal packaging material 210 is solidified to form the packaging layer 140.

It should be noted in particular that, two screen printing processes and two light solidifying processes are specifically executed in this embodiment. In order to avoid being too lengthy, only one screen printing process and one light solidifying process are shown. The specific steps are described as follows.

After the step S701, the first screen printing process will be performed, and is mainly about coating the non-packaging area 144 of the packaging layer 140. The first light solidifying process is executed to solidify the colloidal packaging material 210 of the non-packaging area 144. Then, the second screen printing process is carried out, in which the charge-coupled device (CCD) is used for accurate alignment, and then the screen printing device 250 is used to coat the packaging area 142 of the packaging layer 140. Then, the second light solidifying process is carried out. The colloidal packaging material 210 of packaging area 142 is solidified by the UV light 260.

Thus, the local stretch packaging structure 100 of the present disclosure is produced. The packaging layer 140 of different thickness is used to make the stretching phenomenon preferentially occur in the non-package area 144, and avoid bending or curved surface forming damage to metal wires or electronic components in the light-emitting display elements 130.

Figure 8:
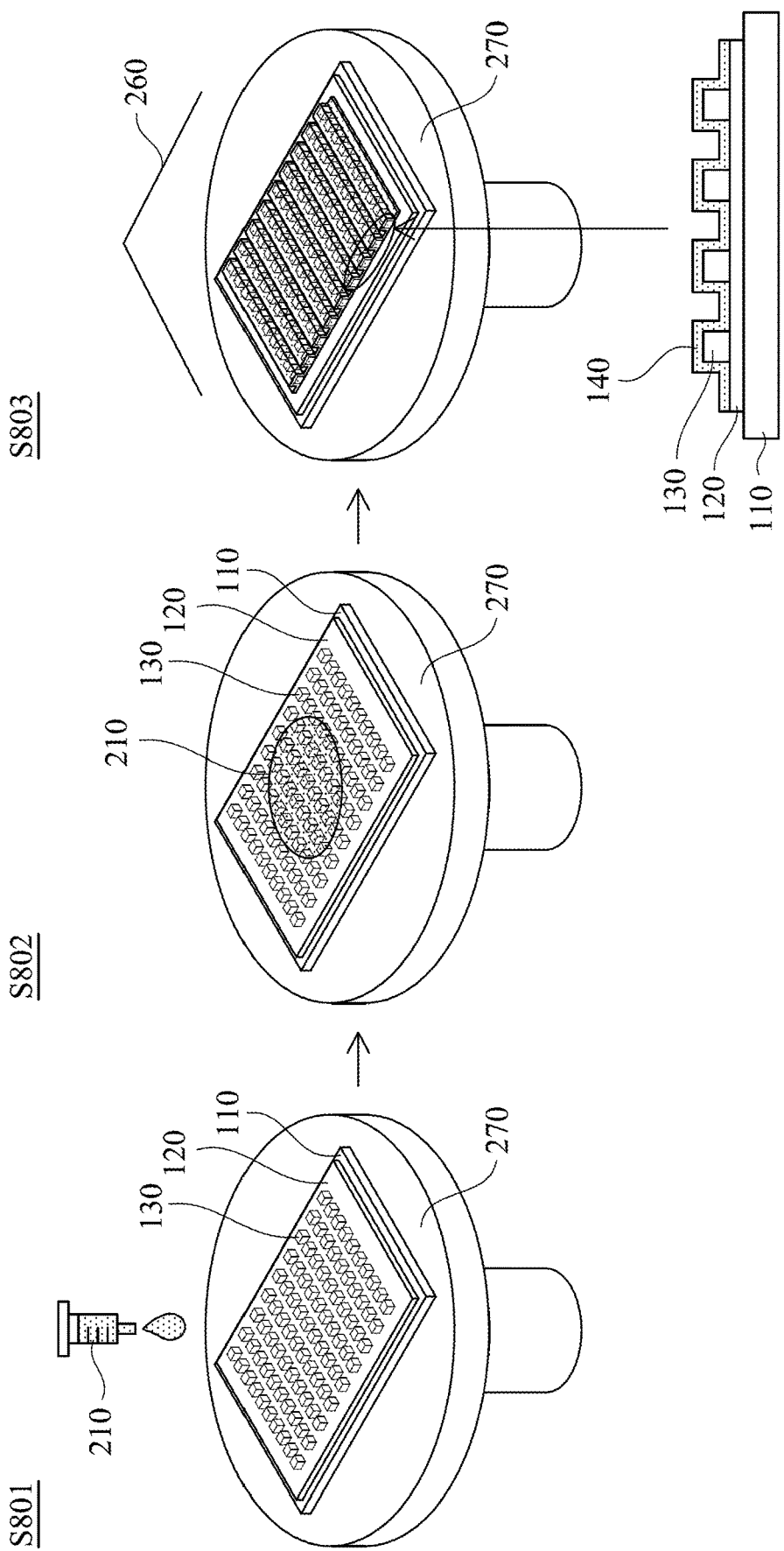
FIG. 8 is a flow diagram of forming the packaging layer by spin coating process according to some embodiments of the present disclosure.

Please refer to FIG. 8. FIG. 8 is a flow diagram of forming the packaging layer by spin coating process according to some embodiments of the present disclosure. As shown in the step S801, the substrate 110, the flexible electronic element 120 and these light-emitting display elements 130 are provided and placed on the spin coating device 270. Next, the colloidal packaging material 210 is measured to prepare for coating.

Then, as shown in the step S802, the spin coating process is carried out. Specifically, the spin coating process is carried out twice in this embodiment, with the first low speed spin coating and the second high speed spin coating. However, for the sake of schematic simplicity, only one spin coating process is shown in FIG. 8. The details are as follows. Because the light-emitting display elements 130 and the flexible electronic element 120 would form a recess and protrusion structure, the first low speed spin coating is used to evenly coat the colloidal packaging material 210 in the recess and protrusion structure formed by the light-emitting display elements 130 and the flexible electronic element 120. That is, the recess and protrusion structure formed by the light-emitting display elements 130 and the flexible electronic element 120 would form a rich area of the colloidal packaging material 210. Next, perform the second high speed spin coating to remove the colloidal packaging material 210 in the aforementioned rich area.

Finally, the coated colloidal packaging material 210 is irradiated with the UV light 260, so that the packaging layer 140 is formed on these light-emitting display elements 130 and part of the flexible electronic element 120. Therefore, the local stretch packaging structure 100 revealed in the present disclosure is created. The packaging layer 140 of different thickness is used to make the stretching phenomenon preferentially occur in the non-package area 144, and avoid bending or curved surface forming damage to metal wires or electronic components in the light-emitting display elements 130.

To sum up, the packaging layer is configured with the packaging area and the non-packaging area, and the height of the non-packaging area is lower than the packaging area, so as to form the packaging layer of different thickness. In addition. Due to the difference in thickness (the packaging area and the non-packaging area) and the difference in storage modulus (the substrate and the packaging layer), the elasticity of the non-packaging area is much higher than that of the packaging area. Therefore, when the structure is stretched during or after processing, the stretching phenomenon will preferentially occur in the non-packaging area, rather than in the packaging area with the light-emitting display elements, so as to avoid bending or curved surface forming damage to the metal wires or electronic components in the light-emitting display elements.

Although the present disclosure has been described in considerable detail with reference to certain embodiments thereof, other embodiments are possible. Therefore, the spirit and scope of the appended claims should not be limited to the description of the embodiments contained herein. It will be apparent to those skilled in the art that various modifications and variations can be made to the structure of the present disclosure without departing from the scope or spirit of the present disclosure. In view of the foregoing, it is intended that the present disclosure cover modifications and variations of the present disclosure provided they fall within the scope of the following claims.

What is claimed is:

1. A local stretch packaging structure, comprising:
   a substrate;
   a flexible electronic element, disposed on the substrate;
   a plurality of light-emitting display elements, disposed on the flexible electronic element; and
   a packaging layer, wherein the packaging layer comprises:
      a packaging area, continuously covering an upper surface and sidewalls of each one of the plurality of light-emitting display elements; and
      a non-packaging area, directly covering the flexible electronic element that is not disposed with the plurality of light-emitting display elements, wherein some portions of the non-packaging area are respectively located between every adjacent two of the light-emitting display element;
   wherein at a processing temperature of the substrate, and the processing temperature is from 80° C. to 180° C.:
      when a storage modulus of the substrate is higher than a storage modulus of the packaging layer, an elasticity of the non-packaging area is higher than 30%, and the elasticity of the non-packaging area increases with the increase of the storage modulus difference between the substrate and the packaging layer;
      when the storage modulus of the substrate is lower than the storage modulus of the packaging layer, the elasticity of the non-packaging area is lower than 30%, and the elasticity of the non-packaging area decreases with the increase of the storage modulus difference between the substrate and the packaging layer;
wherein the storage modulus of the substrate at the processing temperature is from 1 MPa to 20000 MPa.

2. The local stretch packaging structure of claim 1, wherein a top surface of the packaging layer over the packaging area is higher than a top surface of the packaging layer over the non-packaging area.

3. The local stretch packaging structure of claim 1, wherein a volume ratio of the non-packaging area to the packaging area is less than 1.

4. The local stretch packaging structure of claim 1, wherein an elasticity of the non-packaging area is higher than an elasticity of the packaging area, and the elasticity difference between the non-packaging area and the packaging area is higher than or equal to 10%, the elasticity of the packaging area is ranged from approximately 4% to approximately 6%, and the elasticity of the non-packaging area is ranged from approximately 14% to approximately 18%.

5. The local stretch packaging structure of claim 1, wherein the substrate is made of polycarbonate, polymethyl methacrylate, polyethylene terephthalate, cyclic olefin polymers or a combination thereof.

6. The local stretch packaging structure of claim 1, wherein the plurality of light-emitting display elements comprises light-emitting diodes, mini light-emitting diodes, micro light-emitting diodes, organic light-emitting diodes, or a combination thereof.

7. The local stretch packaging structure of claim 1, wherein the packaging layer is made of epoxy resin, silicone, acrylic resin or a combination thereof.

8. The local stretch packaging structure of claim 1, wherein a storage modulus of the packaging layer at a processing temperature of the substrate is from 1 MPa to 10000 MPa.

9. The local stretch packaging structure of claim 1, wherein the packaging layer is made of epoxy resin, silicone, acrylic resin or a combination thereof, and a glass transition temperature of the packaging layer is from −20° C. to 150° C.

10. A method of manufacturing a local stretch packaging structure, comprising steps of:
providing a substrate;
disposing a flexible electronic element on the substrate;
disposing a plurality of light-emitting display elements on the flexible electronic element; and
disposing a packaging layer on the plurality of light-emitting display elements and a portion of the flexible electronic element,
wherein the packaging layer comprises a packaging area and a non-packaging area, the packaging area continuously covers an upper surface and sidewalls of each one of the plurality of light-emitting display elements, and the non-packaging area directly covers the flexible electronic element that is not disposed with these light-emitting display elements, some portions of the non-packaging area are respectively located between every adjacent two of the light-emitting display element;
wherein at a processing temperature of the substrate, and the processing temperature is from 80° C. to 180° C.:
when a storage modulus of the substrate is higher than a storage modulus of the packaging layer, an elasticity of the non-packaging area is higher than 30%, and the elasticity of the non-packaging area increases with the increase of the storage modulus difference between the substrate and the packaging layer;
when the storage modulus of the substrate is lower than the storage modulus of the packaging layer, the elasticity of the non-packaging area is lower than 30%, and the elasticity of the non-packaging area decreases with the increase of the storage modulus difference between the substrate and the packaging layer;
wherein the storage modulus of the substrate at the processing temperature is from 1 MPa to 20000 MPa.

11. The method of claim 10, wherein the step of disposing the packaging layer on the plurality of light-emitting display elements and the portion of the flexible electronic element comprises:
measuring and coating a packaging material on the plurality of light-emitting display elements and the portion of the flexible electronic element;
aligning a plurality of recesses of a mold to the plurality of light-emitting display elements, and aligning a plurality of protrusions of the mold to the flexible electronic element that is not disposed with the plurality of light-emitting display elements;
pressing the mold, and heating and solidifying the packaging material, then forming the packaging layer on the plurality of light-emitting display elements and the portion of the flexible electronic element; and
cooling the packaging layer and removing the mold.

12. The method of claim 10, wherein the step of disposing the packaging layer on the plurality of light-emitting display elements and the portion of the flexible electronic element comprises:
aligning a plurality of recesses of a mold to the plurality of light-emitting display elements, and aligning a plurality of protrusions of the mold to the flexible electronic element that is not disposed with the plurality of light-emitting display elements, wherein the mold is not attached with the plurality of light-emitting display elements and the flexible electronic element;
injecting a packaging material between the mold and the plurality of light-emitting display elements and the flexible electronic element;
heating and solidifying the packaging material, then forming the packaging layer on the plurality of light-emitting display elements and the portion of the flexible electronic element; and
cooling the packaging layer and removing the mold.

13. The method of claim 12, wherein the mold is made of vulcanized silicone rubber, polydimethylsiloxane or a combination thereof.

14. The method of claim 10, wherein the step of disposing the packaging layer on the plurality of light-emitting display elements and the portion of the flexible electronic element comprises:
measuring and coating a packaging material along the upper surface and sidewalls of each one of the plurality of light-emitting display elements and surfaces of the portion of the flexible electronic element; and
applying UV light to solidify the packaging material, so that the packaging layer is formed on the plurality of light-emitting display elements and the portion of the flexible electronic element.

15. The method of claim 14, wherein the step of coating the packaging material comprises screen printing process or spin coating process.

16. The method of claim 10, wherein a top surface of the packaging layer over the packaging area being higher than a top surface of the packaging layer over the non-packaging area.

17. The method of claim 10, wherein an elasticity of the non-packaging area is higher than an elasticity of the packaging area, and the elasticity difference between the non-packaging area and the packaging area is higher than or equal to 10%, the elasticity of the packaging area is ranged from approximately 4% to approximately 6%, and the elasticity of the non-packaging area is ranged from approximately 14% to approximately 18%.

18. The method of claim 10, wherein a volume ratio of the non-packaging area to the packaging area is less than 1.

\* \* \* \* \*